United States Patent
Yun et al.

(10) Patent No.: US 6,432,238 B1
(45) Date of Patent: Aug. 13, 2002

(54) METHOD FOR FABRICATING PIEZOELECTRIC/ELECTROSTRICTIVE THICK FILM USING SEEDING LAYER

(75) Inventors: Sang Kyeong Yun; Dong-Hoon Kim, both of Suwon (KR)

(73) Assignee: Samsung Electro-Mechanicals Co., Ltd., Kyungki-Do (KR)

( * ) Notice: Subject to any disclaimer, the term of this patent is extended or adjusted under 35 U.S.C. 154(b) by 0 days.

(21) Appl. No.: 09/330,557

(22) Filed: Jun. 11, 1999

(30) Foreign Application Priority Data

Dec. 30, 1998 (KR) .............................. 98-60642

(51) Int. Cl.[7] ........................ B32B 31/26; H01L 41/24; C04B 35/622
(52) U.S. Cl. ................... 156/89.12; 156/89.14; 156/89.16; 264/614; 264/621; 427/100; 427/372.2; 427/377; 427/380; 427/419.3
(58) Field of Search ................... 156/89.12, 89.11, 156/89.14, 89.16; 427/100, 372.2, 379, 380, 377, 419.1, 419.2, 419.3; 264/614, 621

(56) References Cited

U.S. PATENT DOCUMENTS

| | | | | |
|---|---|---|---|---|
| 5,112,433 A | * | 5/1992 | Dawson et al. | |
| 5,198,269 A | * | 3/1993 | Swartz et al. | |
| 5,453,294 A | * | 9/1995 | Ogi et al. | |
| 5,691,752 A | * | 11/1997 | Moynihan et al. | |
| 5,914,507 A | * | 6/1999 | Polla et al. | |
| 5,984,458 A | * | 11/1999 | Murai | |
| 5,993,901 A | * | 11/1999 | Abe | |
| RE36,573 E | * | 2/2000 | Barrow et al. | |
| 6,066,581 A | * | 5/2000 | Chivukula et al. | |
| 6,097,133 A | * | 8/2000 | Shimada et al. | |
| 6,140,746 A | * | 10/2000 | Miyashita et al. | |

* cited by examiner

Primary Examiner—Curtis Mayes
(74) Attorney, Agent, or Firm—Darby & Darby

(57) ABSTRACT

Disclosed is a method for fabricating a piezoelectric/electrostrictive thick film, using a seeding layer. On a substrate is formed the seeding layer which is prepared from a ceramic sol solution or a ceramic paste, both identical or similar in composition to the piezoelectric/electrostrictive film. The ceramic paste is prepared from a mixture of a ceramic oxide powder, which has a particle size of 5 μm or less and is prepared from Pb and Ti-based piezoelectric/electrostrictive elements by a non-explosive oxidation-reduction combustion reaction at 100–500° C., and a ceramic sol solution in water or an organic solvent, identical or similar in composition to the ceramic oxide powder. Then, the seeding layer is subjected to an after-treatment. A piezoelectric/electrostrictive film is directly formed on the seeding layer. Alternatively, a piezoelectric/electrostrictive film, separately formed and sintered, is attached on the seeding layer.

88 Claims, 7 Drawing Sheets

METHOD FOR FABRICATING PIEZOELECTRIC/ELECTROSTRICTIVE THICK FILM USING SEEDING LAYER

BACKGROUND OF THE INVENTION

1. Field of the invention

The present invention relates, in general, to a method for fabricating a piezoelectric/electrostrictive thick film using a seeding layer and, more particularly, to an improvement in the bonding properties between a substrate and a piezoelectric/electrostrictive film, along with the method.

2. Description of the Prior Art

In fabricating various film-type devices with ceramics, typically used is ceramic sol with a controlled viscosity or suitably modified ceramic powder. When the ceramic sol or ceramic powder is applied on substrates to give piezoelectric/electrostrictive films, especially, thick films, the solid bonding between substrates and piezoelectric/electrostrictive films is one of the most important factors which determine the quality of the devices fabricated.

Where the materials of the substrates are of the same as or similarity to the ceramics applied, no problems occur in the bonding between substrates and piezoelectric/electrostrictive films. However, where the materials of the substrates are non-ceramic or where the materials, even if they are ceramic, are different in crystal structure, surface property and reactivity from the ceramics applied, a poor bonding results therebetween. If so, the resulting device may suffer from a variety of problems, including separation of the piezoelectric/electrostrictive film from the substrate, progression of cracking in the piezoelectric/electrostrictive film in the vertical direction to the piezoelectric/electrostrictive film, and degradation acceleration of the ceramic material with the repetitive use of the device.

Particularly, as the piezoelectric/electrostrictive film is formed more thickly, the mechanical stress which is generated upon drying the piezoelectric/electrostrictive film has a greater influence on the bonding between the substrate and the piezoelectric/electrostrictive film. For piezoelectric/electrostrictive thick film, therefore, more significant account must be taken of improving the bonding property between a substrate and a piezoelectric/electrostrictive film.

Conventionally, in order to secure the solid bonding between a substrate and a piezoelectric/electrostrictive film and to prevent undesirable reactions at the interface therebetween, various attempts have been made: for example, a buffer layer is inserted between a substrate and a piezoelectric/electrostrictive film; a small thickness is set to the film to be formed in one round, reducing the mechanical stress; and an adhesive is used to bond a bulk to a substrate.

Of them, the recruitment of a buffer layer is representative. According to this technique, a metal thin film is deposited on a substrate by a sol-gel coating method, a sputtering method or an electrochemical method and thermally treated to give a buffer layer, followed by the formation of a piezoelectric/electrostrictive film on the buffer layer. As the buffer layer, a metal film such as titanium or platinum is typically used.

In order to better understand the background of the invention, a description will be given of such conventional methods in conjunction with the accompanying drawings.

With reference to FIG. 1, there is illustrated a fabrication method of a piezoelectric/electrostrictive film using a buffer layer. As shown in this figure, on a substrate is deposited a metal layer, such as titanium or platinum, which is subsequently subjected to thermal treatment to give a buffer layer. Then, a piezoelectric/electrostrictive film is formed on the buffer layer.

Illustrated in FIG. 2 is the same process as in FIG. 1 except that a substrate is thermally treated in advance of the formation of a buffer layer. In detail, the silicon substrate undergoes thermal oxidation to grow a silicon dioxide ($SiO_2$) layer atop which a titanium or platinum thin film is then deposited. A thermal treatment allows the metal thin film to be used as a buffer. Subsequently, the buffer layer is overlaid by a piezoelectric/electrostrictive film.

The thermal treatments at high temperatures for the surface treatment of the substrate or the formation of the buffer make the above-mentioned techniques complicated. In addition, the techniques suffer from a disadvantage in that the resulting devices are poor in stability owing to the repetitive thermal treatments at high temperatures.

Referring to FIG. 3, there is a mechanical stress reducing technique of mechanical stress which is conducted in such a way that a film fraction to be formed in one round is as thin as possible. According to this technique illustrated in FIG. 3, a piezoelectric/electrostrictive thin film with a thickness of hundreds nm is deposited or coated over a substrate and thermally treated at high temperatures and this procedure is repeated until a desired thickness is obtained. When a piezoelectric/electrostrictive thick film is formed by this technique, the repetitive thermal history forces the initially formed piezoelectric/electrostrictive film fractions to be diffused over the substrate. This diffusion of piezoelectric/electrostrictive film gives an advantage of strengthening the bonding between the piezoelectric/electrostrictive film and the substrate, but suffers from a disadvantage in that an interfacial reaction therebetween occurs to denature the materials used or to degenerate their physical properties. In addition, a limit resides in the film thickness which can be obtained by such a repetitive film forming process.

Another technique is to use an adhesive to bond a piezoelectric/electrostrictive film on a substrate. Usually, this technique is used where a piezoelectric/electrostrictive film, consisting of ceramic bulk, is separately constructed and bonded to a substrate. As shown in FIG. 4, this technique is conducted by coating an adhesive, usually a thermocuring adhesive, on a substrate, applying a piezoelectric/electrostrictive film, separately formed and sintered, to the adhesive, and curing the adhesive to firmly fix the film and the substrate. The adhesive layer thus formed is excessively thick, amounting, in thickness, to 7–15 $\mu$m. In addition, the adhesive layer tends to be non-uniform in its surface or may contain pores therein which bring depreciation in quality and production yield to the devices.

It is well known to use a seeding layer in forming a piezoelectric/electrostrictive film. However, the conventional methods are confined within a boundary in that the piezoelectric/electrostrictive thin film is formed at a thickness of 1 $\mu$m or less with the aid of a sol-gel multiple coating process, a dry process such as sputtering, or a electrocrystallization process. The conventional methods cannot be used where a printing process or molding process is applied or a piezoelectric/electrostrictive thick film is formed.

SUMMARY OF THE INVENTION

Therefore, it is an object of the present invention to overcome the above problems encountered in prior arts and to provide a method for fabricating a piezoelectric/electrostrictive thick film, by which a solid bonding is formed between a piezoelectric/electrostrictive film and a substrate, improving the reliability of the resulting devices.

In accordance with an aspect of the present invention, there is provided a method for fabricating a piezoelectric/electrostrictive thick film, using a seeding layer, comprising the steps of: providing a substrate; forming on the substrate the seeding layer from a first ceramic sol solution or a ceramic paste, both identical or similar in composition to the piezoelectric/electrostrictive film, said ceramic paste being prepared from a mixture of a ceramic oxide powder, which has a particle size of 5 μm or less and is prepared from Pb and Ti-based piezoelectric/electrostrictive elements by a non-explosive oxidation-reduction combustion reaction at 100–500° C., and a second ceramic sol solution in water or an organic solvent, identical or similar in composition to said ceramic oxide powder; subjecting the seeding layer to an after-treatment to improve the reactivity of the seeding layer and to prevent undesirable reaction between the seeding layer and the substrate; forming a piezoelectric/electrostrictive film on the seeding layer to a desirable thickness; and thermally treating the piezoelectric/electrostrictive film and the seeding layer at 100–600° C. to sinter the seeding layer and the piezoelectric/electrostrictive film and to solidify the bonding between the film and the substrate, whereby the piezoelectric/electrostrictive thick film is allowed to show a superb bonding to the substrate in the low temperature thermal treatment.

In accordance with another aspect of the present invention, there is provided a method for fabricating a piezoelectric/electrostrictive thick film, using a seeding layer, comprising the steps of: providing a substrate; forming on the substrate the seeding layer from a first ceramic sol solution or a ceramic paste, both identical or similar in composition to the piezoelectric/electrostrictive film, said ceramic paste being prepared from a mixture of a ceramic oxide powder, which has a particle size of 5 μm or less and is prepared from Pb and Ti-based piezoelectric/electrostrictive elements by a non-explosive oxidation-reduction combustion reaction at 100–500° C., and a second ceramic sol solution in water or an organic solvent, identical or similar in composition to said ceramic oxide powder; partially drying said seeding layer at room temperature to 150° C. to provide said seeding layer with a proper viscosity for bonding; attaching on said partially dried seeding layer a piezoelectric/electrostrictive film, said piezoelectric/electrostrictive film being separately formed from a ceramic oxide powder which has a particle size of 5 μm or less and is prepared from Pb and Ti-based piezoelectric/electrostrictive elements by a non-explosive oxidation-reduction combustion reaction at a low temperature of 100–500° C.; and thermally treating said piezoelectric/electrostrictive film at 100 to 600° C. to sinter the seeding layer and the piezoelectric/electrostrictive film and to solidify the bonding between the film and the substrate, whereby the piezoelectric/electrostrictive thick film is allowed to show a superb bonding to the substrate in the low temperature thermal treatment.

In accordance with a further aspect of the present invention, there is provided a method for fabricating a piezoelectric/electrostrictive thick film, using a seeding layer, comprising the steps of: providing a substrate; forming on the substrate the seeding layer from a first ceramic sol solution or a ceramic paste, both identical or similar in composition to the piezoelectric/electrostrictive film, said ceramic paste being prepared from a mixture of a ceramic oxide powder, which has a particle size of 5 μm or less and is prepared from Pb and Ti-based piezoelectric/electrostrictive elements by a non-explosive oxidation-reduction combustion reaction at 100–500° C., and a second ceramic sol solution in water or an organic solvent, identical or similar in composition to said ceramic oxide powder; partially drying said seeding layer at room temperature to 150° C. to provide said seeding layer with a proper viscosity for bonding; attaching a piezoelectric/electrostrictive film, separately molded and sintered, on said partially dried seeding layer; and thermally treating said piezoelectric/electrostrictive film at 100 to 600° C. to sinter the seeding layer and the piezoelectric/electrostrictive film and to solidify the bonding between the film and the substrate, whereby the piezoelectric/electrostrictive thick film is allowed to show a superb bonding to the substrate in the low temperature thermal treatment.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
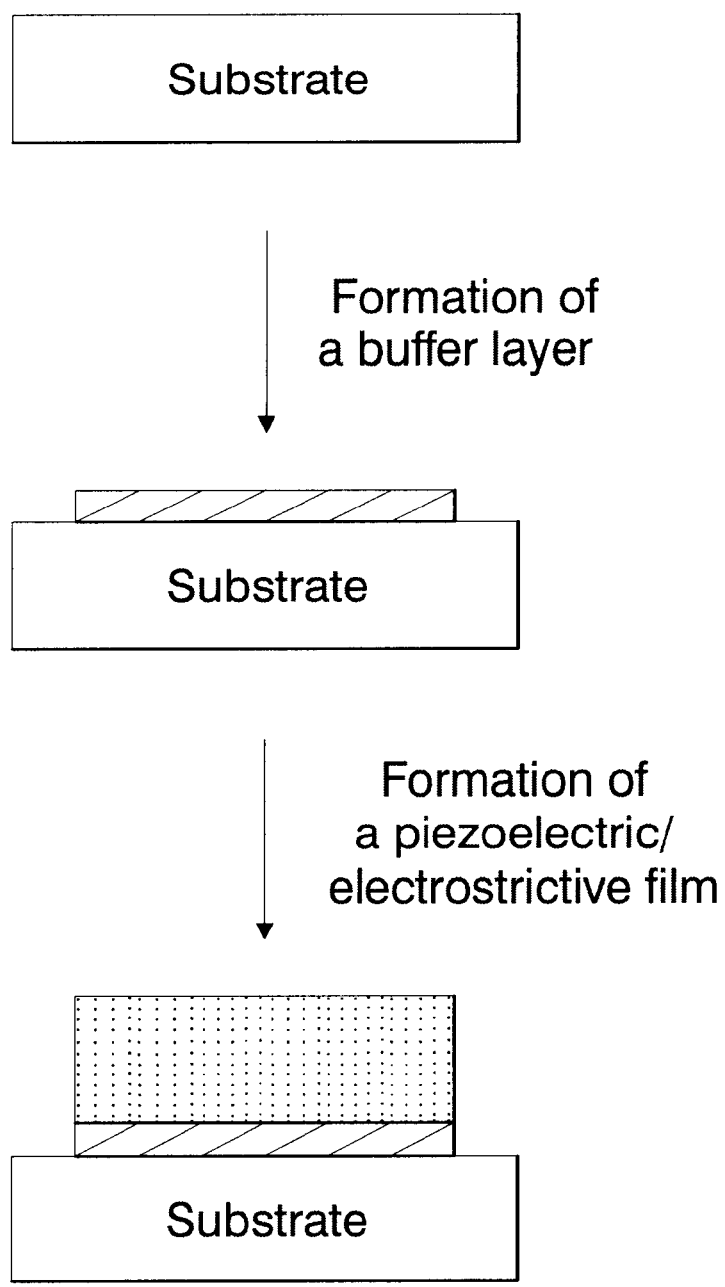
FIG. 1 is a process diagram illustrating a conventional method of bonding a piezoelectric/electrostrictive film to a substrate, using a buffer layer.
Figure 2:
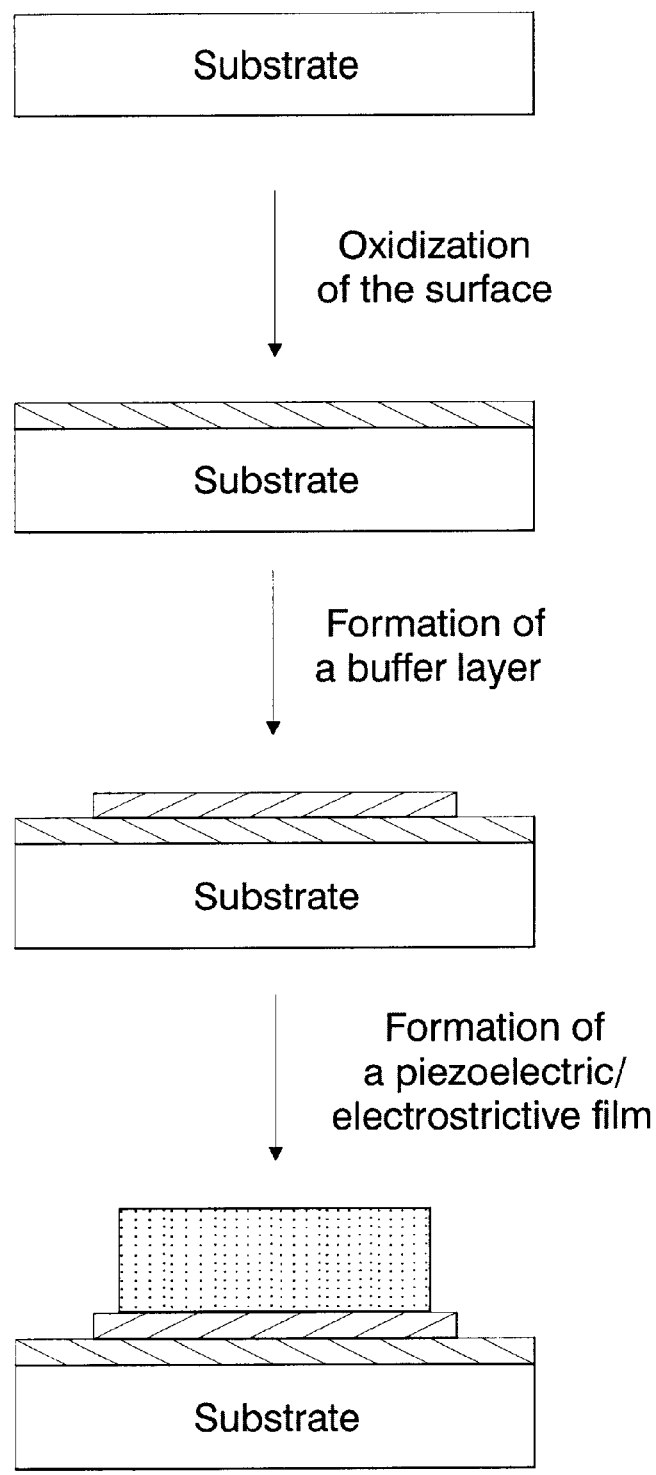
FIG. 2 is a process diagram illustrating a conventional method of bonding a piezoelectric/electrostrictive film to a substrate, using a buffer layer and the thermal oxidation of the substrate.
Figure 3:
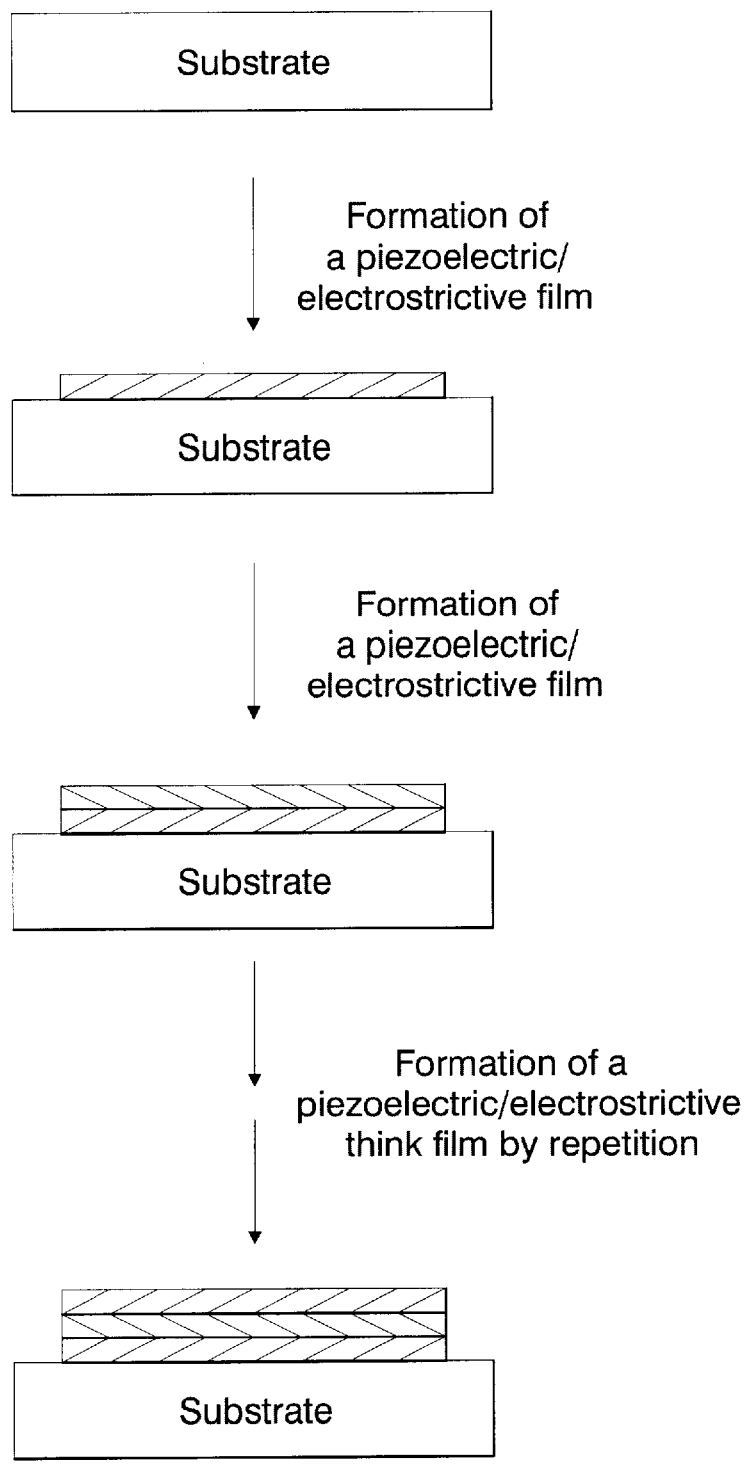
FIG. 3 is a process diagram illustrating a conventional method for fabricating a piezoelectric/electrostrictive thick film through the repetitive formation of a piezoelectric/electrostrictive film fraction.
Figure 4:
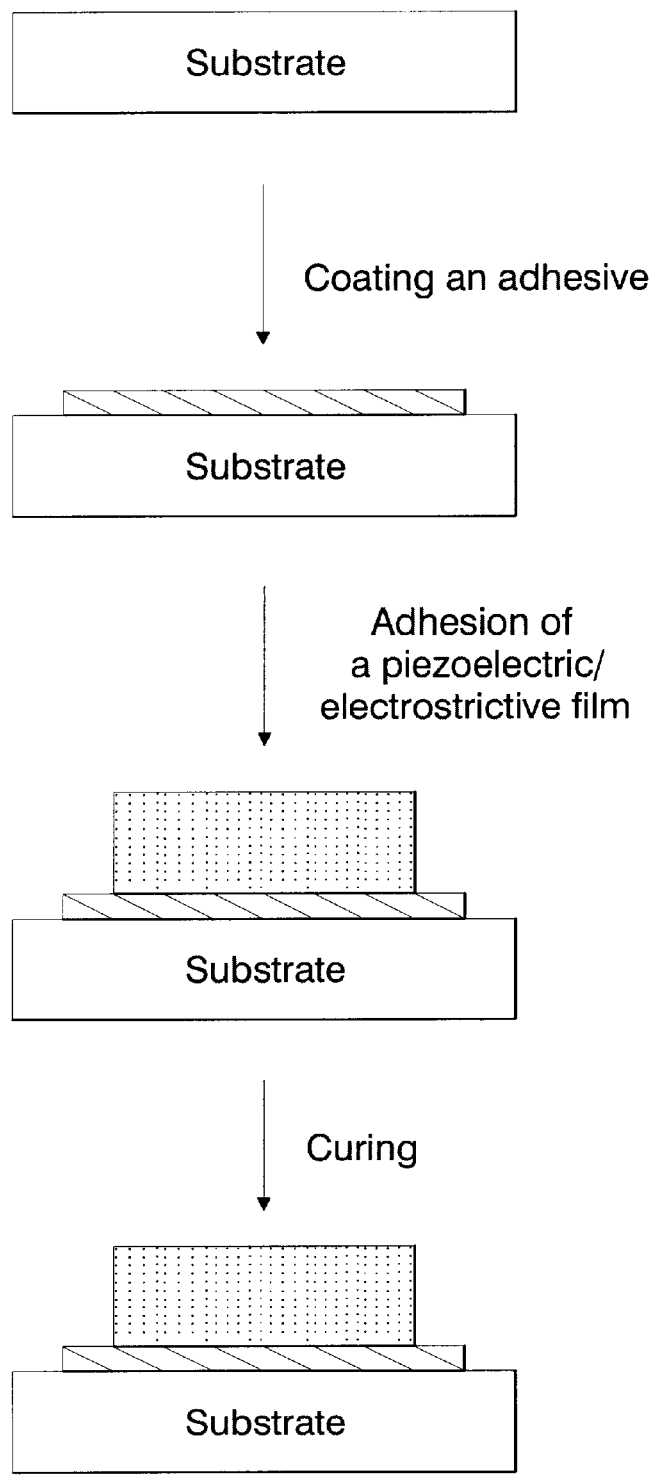
FIG. 4 is a process diagram illustrating a conventional method of bonding a piezoelectric/electrostrictive thick film, using an adhesive.

Details will be given of the invention, below.

In accordance with the present invention, the fabrication of a piezoelectric/electrostrictive thick film is conducted in two manners: one is to form a piezoelectric/electrostrictive film directly on a seeding layer atop a substrate; and the other is to bond a piezoelectric/electrostrictive film, separately prepared, to a seeding layer on a substrate.

As the substrate, a metal plate or a ceramic plate with an electrode thereon is used. As for the metal plate, it is made of stainless steel (SUS) or nickel (Ni). Examples of useful ceramic include a metal oxide such as aluminum oxide ($Al_2O_3$), a non-metal carbide such as silicon dioxide ($SiO_2$), a non-metal oxide such as silicon carbide (SiC), and a non-metal nitride such as silicon nitride ($Si_3N_4$).

In present invention, the seeding layer is made of a ceramic sol solution which has the same composition as or a similar composition to the ceramic used for the piezoelectric/electrostrictive film or of a ceramic paste prepared from a mixture of the ceramic sol solution and a ceramic oxide powder, thereby improving the bonding property between the substrate and the piezoelectric/electrostrictive film.

The ceramic sol solution useful for the seeding layer employs water or an organic solvent as a base in which ceramic components are dissolved. Preferred is a ceramic sol solution with a concentration of 0.1–5 M. The organic solvent is selected preferably from the group consisting of acetic acid, dimethyl formamide, methoxyethanol, glycols and alcohols. If necessary, after a concentrated ceramic sol solution is prepared, it may be diluted in the same base to a suitable concentration just before use.

As for the ceramic paste, it is prepared from a mixture of a ceramic oxide powder and a ceramic sol, both having ceramic components which are the same as or similar to those of the piezoelectric/electrostrictive film.

In order to prepare the ceramic oxide powder useful in the present invention, the ceramic components or their raw materials are well dissolved in a solvent to give a solution which is added with citric acid at an amount enough to cause a redox reaction with the anions of the ceramic components, followed by baking the resulting mixture at 100–500° C. Alternatively, the ceramic components or their raw materials may be uniformly dispersed in a dispersant, instead of being dissolved in the solvent. Subsequently, the dispersant is added with citric acid and baked, as above. If necessary, a thermal treatment at 700–900° C. may be further carried out to improve the crystallinity of the powder.

The raw materials of the ceramic components may be in a form of oxides, carbonates, nitrates, organic or inorganic salts, or complexes.

In accordance with the present invention, Pb/Ti-based piezoelectric/electrostrictive ceramic elements are used as the ceramic components. Preferable are those which comprise a group consisting of lead (Pb), zirconium (Zr), titanium (Ti) or a group consisting of lead (Pb), magnesium (Mg), and niobium (Nb).

As mentioned above, the ceramic components or their raw materials are dissolved in a solvent or dispersant. Thus, the solvent or dispersant must be able to dissolve and disperse the components or raw materials. It may be water or an organic solvent selected from dimethyl formamide, methoxy ethanol, acetic acid, glycols and alcohols.

During preparation of the ceramic oxide powder, citric acid serves as a combustion aid. In conventional methods, citric acid is used not as a combustion aid but as a complexing agent to allow a homogeneous reaction. For instance, the Pechini process takes advantage of citric acid. However, the present invention utilizes both the combustibility and complexing effect of citric acid, so as to perform a combustion reaction at a controlled rate.

To the solution or dispersion of the ceramic components is added citric acid. The amount of citric acid added must be of such a level or more, that an oxidation-reduction combustion reaction with the anions of the ceramic components can occur. The reaction rate can be controlled by the amount of citric acid added.

At a temperature of 100–500° C., the mixture of the ceramic components and citric acid is baked. As the baking temperature is higher, the crystallinity of the ceramic phase obtained is more improved. However, 100° C. is high enough to initiate the combustion reaction of citric acid while higher than 500° C., even though sufficiently inducing the reaction, is fruitless compared with conventional methods. Preferably, the baking is performed at 150–300° C. This temperature range is properly low, allowing the crystallinity of the ceramic phase to be formed certainly.

During the combustion reaction, the citric acid is removed and a ceramic oxide is formed without scattering by virtue of the non-explosive reaction. In addition, the ingredients which are not the ceramic components are removed by the combustion reaction, so that there is formed a pure ceramic oxide powder, free of impurities.

The ceramic oxide powder thus prepared is 5 $\mu$m or less in particle size and preferably 1 $\mu$m or less with a uniform particle size distribution. Its primary particle is in the form of an independent body or a soft aggregate. In addition, the primary particles are of a completely burned ceramic phase, so that their weight is not reduced by a further thermal treatment. Furthermore, since the reactivity of the surface of the powder is superb, it can be shaped by a thermal treatment of a low temperature. Therefore, the powder of the invention gives a high degree of freedom to the substrate of the resulting device and makes it possible to use a printing or coating method.

With the aim of increasing the crystallinity of the ceramic oxide powder prepared, a thermal treatment at 700–900° C. may be further conducted.

Together with the ceramic sol solution prepared above, the ceramic oxide powder is used to produce a ceramic paste. In this regard, the ceramic oxide powder is preferably made of PZT, PMN or their solid solution (PZT-PMN). This ceramic oxide powder may further comprise one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), manganese (Mn) and/or combinations thereof.

It is preferable that the ceramic sol solution is added at an amount of 1 to 200 weight parts based on 100 weight parts of the ceramic oxide. For example, if the amount of the ceramic sol solution is over 200 weight parts, the mixture is too low in viscosity. On the other hand, if the ceramic sol solution is added at an amount less than 1 weight parts, the resulting mixture is too viscous.

More preferably, the ceramic sol solution is added at an amount of 10 to 100 weight parts based on 100 weight parts of the ceramic oxide.

If the ceramic oxide powder is mixed with the ceramic sol solution, the ceramic sol solution of a liquid phase is uniformly coated on the surface of the ceramic oxide powder of a solid phase, effectively filling the voids between the particles of the powder to connect one particle to another. In the resulting powder-sol mixture, the particles of the ceramic oxide powder, which has ceramic characteristics, are surrounded by the ceramic sol solution whose components are the same as or similar to those of the powder, becoming fluid. Serving as a reaction medium on the surface of the ceramic oxide powder, the ceramic sol improves the reactivity of the surface.

As far as the organic component in the sol is concerned, when the powder-sol mixture is brought into contact with another organic material, it secures stability at the contact interface, enabling the mixture to be of dispersibility and homogeneity.

At a low temperature, the sol can be thermally decomposed and because the residue has the components the same as or similar to those of the ceramic oxide powder, a ceramic system in which the particles are sufficiently connected with each other can be obtained at a low temperature.

In order to secure the stability and fluidity necessary to shape the powder-sol mixture, an organic solvent may be added to adjust the physical properties of the mixture. It may be selected from various solvents, but preferably from glycols and alcohols because they are of some viscosity and of low volatility at room temperature. Its amount preferably ranges from 1 to 100 weight parts based on 100 weight parts of the ceramic oxide powder. For example, if the organic solvent for adjusting the mixture is added at an amount less than 1 weight part, no effects can be obtained from the organic solvent. On the other hand, if the added amount of the organic solvent is over 100 weight parts, the mixture cannot maintain a viscosity, but becomes too dilute to be molded. More preferably, the organic solvent for adjusting the physical properties of the sol-gel mixture is added at an amount of 10–40 weight parts based on 100 weight parts of the ceramic oxide powder. Within this range, the organic solvent allows the viscosity of the mixture to be properly maintained as well as accomplishes the effect of adjusting the physical properties.

In addition, in order to further improve the dispersibility and homogeneity of the powder-sol mixture added with the organic solution, a small amount of an organic material may be used. Suitable are long chain alcohols or polar organic solvents. Preferable examples include pentanol and hexanol for the long chain alcohol, and acetyl acetone and methoxy ethane for the polar organic solvent. The organic material preferably ranges, in quantity, from 1 to 100 weight parts based on 100 weight parts of the ceramic oxide powder. For example, if the organic solvent for adjusting the mixture is added at an amount less than 1 weight part, no effects can be obtained from the organic material. On the other hand, if the added amount of the organic solvent is over 100 weight parts, the mixture cannot maintain a viscosity, but becomes too dilute to be molded. More preferably, the organic material is added at an amount of 10–40 weight parts based on 100 weight parts of the ceramic oxide powder. Within this range, the organic material allows the viscosity of the mixture to be properly maintained as well as accomplishes the effect of adjusting the physical properties.

Now, attention will be directed to the direct formation of a piezoelectric/electrostrictive film on a seeding layer using the ceramic sol solution or the ceramic paste and this will be described in connection with FIG. 5.

Figure 5:
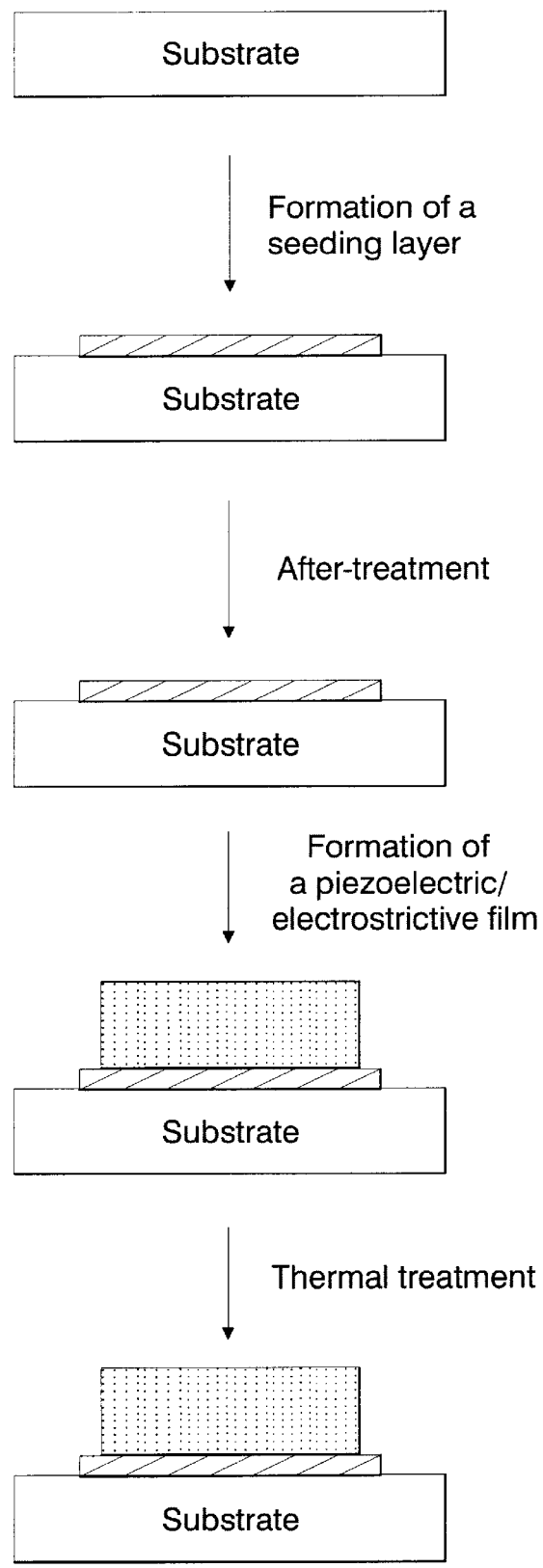
FIG. 5 is a process diagram illustrating a method for fabricating a piezoelectric/electrostrictive thick film, using a seeding layer, in which a piezoelectric/electrostrictive film is directly formed on the seeding layer, in accordance with a first embodiment of the present invention.

As shown in FIG. 5, first, the ceramic sol solution or ceramic paste prepared as in above, is applied on a substrate to form a seeding layer. Various techniques may be utilized for the application of the ceramic paste. Of them, a printing method is typical. As far as the ceramic sol solution is concerned, a coating method is usually used.

The seeding layer is preferably formed in a thickness of 1 $\mu$m or less and more preferably 200–300 nm.

When forming the seeding layer, a suitable masking tool is used to give a pattern to the seeding layer.

Next, an after-treatment is carried out with the aim of not only improving the reactivity of the seeding layer, but restraining its undesirable reactions with the piezoelectric/electrostrictive film or the substrate. For the after-treatment, drying, oxidation/reduction, surface treatment and thermal treatment at a low temperature may be utilized alone or in combination.

Where a drying technique is taken to stabilize the seeding layer, it is conducted at a temperature from room temperature to 150° C. and more preferably from 50–70° C.

This drying step is one of the most intensive attention-required steps in the formation of the seeding layer. Care must be taken not to produce a crack or a pore on the surface or in the structure of the ceramic sol. In order to prevent the generation of cracks or pores on the surface or in the structure of the seeding layer upon drying, it is recommended that the seeding layer is dried in a drying chamber which is saturated with the organic solvent used as a base, followed by volatilizing the solvent at a proper temperature. Under this drying condition, the seeding layer, even if undergoing pyrolysis to form a ceramic phase or gel, has not detrimental influence on the bonding with a piezoelectric/electrostrictive film to be formed later.

There are various techniques which can effect oxidation/reduction on the seeding layer. A representative technique is that the seeding layer is dried in the air so as to bring about partial air oxidation.

The surface treatment of the seeding layer is typically conducted by flowing alcohol vapor into a chamber in which the seeding layer is placed.

In regard to the low temperature thermal treatment, it is accomplished by sintering the seeding layer at 100–600° C. and preferably at 150–300° C.

After completion of the after-treatment for the seeding layer, a piezoelectric/electrostrictive thick film is formed directly on the seeding layer in a printing method, a molding method or a coating method.

Where the piezoelectric/electrostrictive thick film is formed by one of the first three methods, a ceramic paste which is the same as that prepared for the seeding layer, is used as a material for the piezoelectric/electrostrictive thick film.

In the printing method, the ceramic paste is printed on the substrate, using a screen. The formation of the piezoelectric/electrostrictive thick film through the molding method is achieved by applying the ceramic paste for the embossed molds formed on the substrate. As an example of the coating method, representative is spin coating the ceramic paste over the substrate. In regard to the coating method, the piezoelectric/electrostrictive thick film is obtained by repetitively coating a piezoelectric/electrostrictive film fraction about 1 $\mu$m or less thick over the substrate. An after-treatment may be also effected on the piezoelectric/electrostrictive thick film-which is formed over the substrate by the coating method. In addition, a masking tool may be used to give a pattern to the piezoelectric/electrostrictive film formed by the coating method.

The completion of film formation may be accomplished by forming the film entirely over the substrate and then, applying an after-treatment. Alternatively, a screen, mold or mask may be mounted on the substrate to produce a piezoelectric/electrostrictive film-type device with a desired pattern.

The piezoelectric/electrostrictive film formed on the seeding layer atop the substrate is thermally treated at a temperature of 100–600° C. and more preferably 150–300° C. Through this thermal treatment, the solvent and organic materials are removed, the piezoelectric/electrostrictive film is sintered, and the seeding layer is turned to a thin film made only of ceramic fine powder, so as to allow a piezoelectric/electrostrictive thick film.

As illustrated, sufficient reactions are elicited by the thermal treatment at such a low temperature from 100 to 600° C. This is attributed to the fact that the same effect as sintering may be accomplished by the reciprocal reaction in which the water on the surface of the ceramic oxide powder induces the hydrolysis of the ceramic sol solution and the ceramic components of the ceramic sol solution, separated as a consequence of the hydrolysis, combine with the ceramic oxide powder.

Next, a description will be given of where, after a seeding layer is formed on a substrate, a separately formed piezoelectric/electrostrictive film is attached on the seeding layer, in conjunction with FIG. 6.

Figure 6:
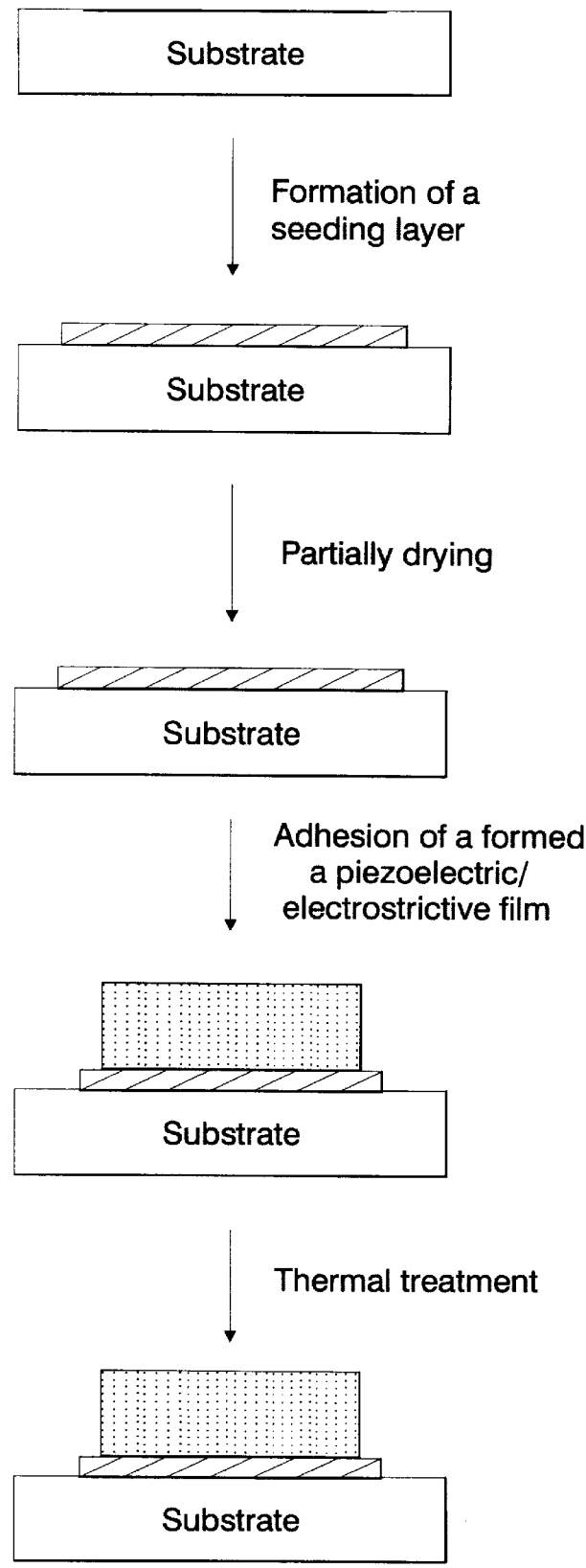
FIG. 6 is a process diagram illustrating a method for fabricating a piezoelectric/electrostrictive thick film, using a seeding layer, in which a piezoelectric/electrostrictive film, separately formed, is attached on the seeding layer atop a substrate, in accordance with a second embodiment of the present invention.

As shown in FIG. 6, the seeding layer is formed by applying the same ceramic sol solution or ceramic paste as prepared above. As in the direct formation, the application of the ceramic sol solution is usually done by a coating method while the ceramic paste is applied by use of a printing method. The seeding layer is preferably formed at a thickness of 1 $\mu$m or less and more preferably 200 to 300 nm. With the aid of a suitable masking tool, a pattern may be given to the seeding layer.

Subsequently, the seeding layer formed is partially dried at a temperature of room temperature to 150° C. and more preferably 50–70° C. to the extent that it becomes properly viscous. In order not to produce cracks or pores on the surface or in the structure of the seeding layer upon the partially drying, it is also recommended that the seeding layer is dried in a drying chamber which is saturated with the organic solvent used as a base when preparing the ceramic sol, followed by volatilizing the solvent at a proper temperature.

Figure 7:
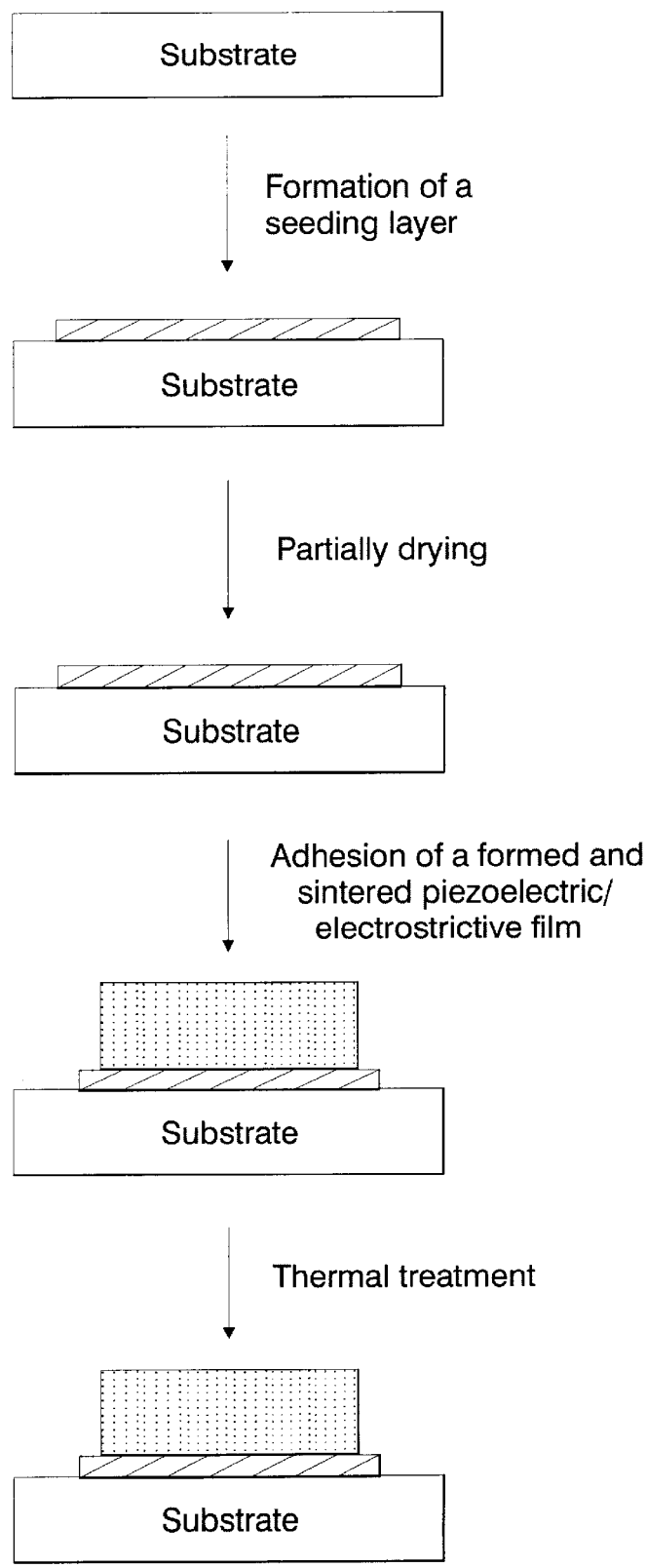
FIG. 7 is a process diagram illustrating a method for fabricating a piezoelectric/electrostrictive thick film, using a seeding layer, in which a piezoelectric/electrostrictive film, separately formed and sintered, is attached on the seeding layer atop a substrate, in accordance with a third embodiment of the present invention.

Thereafter, on the seeding layer which is endowed with a proper viscosity by partially drying, a separately formed piezoelectric/electrostrictive thick film is bonded. Alternatively, instead of the separately, formed piezoelectric/electrostrictive thick film, a separately formed and sintered piezoelectric/electrostrictive thick film is used, as shown in FIG. 7.

Following this, conducting a thermal treatment at 100–600° C. and more preferably at 150–300° C. results in a solid bonding between the piezoelectric/electrostrictive film and the substrate. This thermal treatment coerces the separately formed thick film into bonding to the seeding layer, pyrolyzing the ceramic sol and sintering the seeding layer and the piezoelectric/electrostrictive film. On the other hand, the separately formed and sintered piezoelectric/electrostrictive film is not sintered further by this thermal treatment, but the seeding layer only is sintered while the bonding between the seeding layer and the piezoelectric/electrostrictive thick film is progressed.

Optionally, a step of pre-baking the piezoelectric/electrostrictive thick film at 100–150° C. may be introduced after attaching the piezoelectric/electrostrictive thick film to the seeding layer and before conducting the above thermal treatment, so that an effective bonding between the piezoelectric/electrostrictive thick film and the seeding layer is induced under a milder condition. If necessary, the thermal treatment may be carried out under pressure, so as to give a uniform bonding between the piezoelectric/electrostrictive thick film and the seeding layer.

After performing the above-illustrated methods, the piezoelectric/electrostrictive thick film preferably ranges, in thickness, from 1 to 100 $\mu$m and more particularly from 5 to 30 $\mu$m.

Because the seeding layer shows good chemical affinity for the piezoelectric/electrostrictive film in addition to being superior in the bonding to the substrate, the existence of the seeding layer between the piezoelectric/electrostrictive film and the substrate contributes a great improvement to the bonding therebetween.

As described above, the use of a seeding layer in fabricating a piezoelectric/electrostrictive thick film on a substrate enables the bonding between the piezoelectric/electrostrictive thick film and the substrate to be solidified by a low temperature thermal treatment, thus improving the reliability of the device as well as simplifying the fabrication process.

In addition, the use of a seeding layer can be effectively applied where a piezoelectric/electrostrictive thick film is fabricated by repeatedly laminating a piezoelectric/electrostrictive thin film in a screen printing manner and where a piezoelectric/electrostrictive thick film is formed once or in two or three process rounds.

Also in the case of bonding a separately formed piezoelectric/electrostrictive film on a substrate, superb quality and reliability can be secured in the resulting devices without problems such as nonuniform interface, production of pores, and deterioration in quality and yield depending on after-treatment conditions.

A better understanding of the present invention may be obtained in light of the following examples which are set forth to illustrate, but are not to be construed to limit the present invention.

EXAMPLE I

A 2 M PZT sol based on acetic acid was diluted with ethanol and an SUS substrate on which a micro-pattern was made after a photoresist film mold, was immersed in the ceramic sol dilution.

The SUS substrate dip-coated with the ceramic sol was dried at 100° C. in a drying chamber, followed by filling a PZT/PMN paste along the micro-pattern formed on the substrate to produce a piezoelectric/electrostrictive thick film. This film was dried at 130° C. for 1 hour and baked at 300° C. for 2 hours to solidify the bonding between the film and the substrate.

EXAMPLE II

On a nickel(Ni) substrate was spin-coated a 0.5 M PZT sol based on methoxyethanol. The resulting substrate was dried at room temperature using a methoxyethanol vapor-saturated drying dish and then, baked at 300° C. for 1 hour to give a PZT thin film.

On the PZT thin film was screen-printed a PZT/PMN paste to form a piezoelectric/electrostrictive thick film which was subsequently dried at 70° C. for 1 hour and then baked 250° C. for 1 hour to solidify the bonding between the thick film and the substrate.

EXAMPLE III

A 2 M PZT sol based on dimethyl formamide was spin-coated on an Ni substrate which is subsequently dried in the air with the surface of the PZT sol being activated through air oxidation.

On this activated PZT sol, a PZT/PMN paste was screen-printed to form a piezoelectric/electrostrictive thick film, using a micro-patterned mask. The film was dried at 130° C. for 1 hour and then, thermally treated at 300° C. for 2 hours to solidify the bonding between the thick film and the substrate.

EXAMPLE IV

A 2 M PZT sol based on acetic acid was spin-coated on an SUS substrate and dried at 50° C. for 5 min to give a coating layer which was of proper viscosity for bonding. To the properly viscous ceramic sol layer was attached a sintered PZT/PMN film 40 μm thick, formed separately.

Under pressure, the sintered film was pre-baked at 130° C. for 1 hour and then, thermally treated at 200° C. for 2 hours to solidify the bonding between the film and the substrate.

EXAMPLE V

A ceramic paste was prepared by mixing a 2 M PZT sol based on acetic acid with a PZT/PMN micro powder, followed by printing the ceramic paste on a thermocuring resin substrate with the aid of a screen 1 μm thick, to form a ceramic layer. To give this ceramic layer a proper viscosity for bonding, it was dried at room temperature for 1 hour, after which a sintered PZT/PMN film 40 μm thick, separately formed, was attached to the ceramic layer.

Under pressure, the sintered film was pre-baked at 130° C. for 1 hour and then, thermally treated at 200° C. for 2 hours to solidify the bonding between the film and the substrate.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for fabricating a piezoelectric/electrostrictive thick film, using a seeding layer, comprising the steps of:
   providing a substrate;
   forming on the substrate the seeding layer from a first ceramic sol solution or a ceramic paste, wherein the first ceramic sol solution or ceramic paste comprises at least one component comprised in the piezoelectric/electrostrictive film, said ceramic paste being prepared from a mixture of a ceramic oxide powder, which has a particle size of 5 μm or less and is prepared from Pb and Ti-based piezoelectric elements by a non-explosive oxidation-reduction combustion reaction at 100–500° C., and a second ceramic sol solution in water or an organic solvent, wherein the second ceramic sol solution comprises at least one component comprised in said ceramic oxide powder;
   subjecting the seeding layer to an after-treatment to improve the reactivity of the seeding layer and to prevent undesirable reaction between the seeding layer and the substrate;
   forming a piezoelectric/electrostrictive film on the seeding layer to a desirable thickness; and
   thermally treating the piezoelectric/electrostrictive film and the seeding layer at 100–600° C. to sinter the seeding layer and the piezoelectric/electrostrictive film and to solidify the bonding between the film and the substrate;
   whereby the piezoelectric/electrostrictive thick film is allowed to show a superb bonding to the substrate in the low temperature thermal treatment wherein said after-treatment includes a drying process carried out by drying said seeding layer in a drying chamber saturated with the vapor of an organic solvent and volatilizing the solvent at a proper temperature from the seeding layer, said organic solvent being identical to that used to prepare The ceramic sol for the seeding layer.

2. A method as set forth in claim 1, wherein said substrate is a metal plate or a ceramic plate with an electrode thereon.

3. A method as set forth in claim 2, wherein said metal plate is made of stainless steel or nickel.

4. A method as set forth in claim 2, wherein said ceramic plate is made of a ceramic oxide, a ceramic carbide or a ceramic nitride.

5. A method as set forth in claim 1, wherein said ceramic oxide powder has a particle size of 1 μm or less.

6. A method as set forth in claim 1, wherein said ceramic oxide powder is selected from the group consisting of lead zirconate titanate, a lead magnesium niobate and a solid solution of lead zirconate titanate and lead magnesium niobate.

7. A method as set forth in claim 6, wherein said ceramic oxide powder further comprises at least one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), and manganese (Mn).

8. A method as set forth in claim 1, wherein said piezoelectric/electrostrictive film ranges, in thickness, from 5 to 100 μm.

9. A method as set forth in claim 8, wherein said piezoelectric/electrostrictive film ranges, in thickness, from 5 to 30 μm.

10. A method as set forth in claim 1, wherein said piezoelectric/electrostrictive film is formed by applying on said seeding layer a ceramic paste prepared from a mixture of a ceramic oxide powder, which has a particle size of 5 μm or less and is prepared from Pb and Ti-based piezoelectric/electrostrictive elements by a non-explosive oxidation-reduction combustion reaction at 100–500° C., with a second ceramic sol solution in water or an organic solvent, wherein the second ceramic sol solution comprises at least one component comprised in said ceramic oxide powder.

11. A method as set forth in claim 10, wherein said ceramic oxide powder is selected from the group consisting of a lead zirconate titanate, a lead magnesium niobate and a solid solution of lead zirconate titanate and lead magnesium niobate.

12. A method as set forth in claim 11, wherein said ceramic oxide powder further comprises at least one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontum (Sr), calcium (Ca), bismuth (Bi), tin (Sn), and manganese (Mn).

13. A method as set forth in claim 10, wherein said piezoelectric/electrostrictive film is formed in a printing process, a molding process or a coating process.

14. A method as set forth in claim 1, wherein said piezoelectric/electrostrictive film is prepared from a mixture of a dispersion of a ceramic oxide powder in a dispersant and a solution of a ceramic sol in an organic solvent.

15. A method as set forth in claim 14, wherein said ceramic oxide powder is selected from the group consisting of a lead zirconate titanate, a lead magnesium niobate and a solid solution composite oxide of lead zirconate titanate and lead magnesium niobate.

16. A method as set forth in claim 15, wherein said ceramic oxide powder further comprises one or more selected from the group consisting of nickel (Ni), lantanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), and manganese (Mn).

17. A method as set forth in claim 1, wherein said seeding layer has a thickness of 1 µm or less.

18. A method as set forth in claim 17, wherein said seeding layer has a thickness from 200 to 300 nm.

19. A method for fabricating a piezoelectric/electrostrictive thick film, using a seeding layer, comprising the steps of:
  providing a substrate;
  forming on the substrate the seeding layer from a first ceramic sol solution or a ceramic paste, wherein the first ceramic sol solution or ceramic paste comprises at least one component comprised in the piezoelectric/electrostrictive film, said ceramic paste being prepared from a mixture of a ceramic oxide powder, which has a particle size of 5 µm or less and is prepared from Pb and Ti-based piezoelectric elements by a non-explosive oxidation-reduction combustion reaction at 100–500° C., and a second ceramic sol solution in water or an organic solvent, wherein the second ceramic sol solution comprises at least one component comprised in said ceramic oxide powder;
  subjecting the seeding layer to an after-treatment to improve the reactivity of the seeding layer and to prevent undesirable reaction between the seeding layer and the substrate;
  forming a piezoelectric/electrostrictive film on the seeding layer to a desirable thickness; and
  thermally treating the piezoelectric/electrostrictive film and the seeding layer at 100–600° C. to sinter the seeding layer and the piezoelectric/electrostrictive film and to solidify the bonding between the film and the substrate,
  whereby the piezoelectric/electrostrictive thick film is allowed to show a superb bonding to the substrate in the low temperature thermal treatment wherein said after-treatment includes an oxidation/reduction process carried out by drying said seeding layer in the air so as to effect partial air oxidation on said seeding layer.

20. A method as set forth in claim 19, wherein said substrate is a metal plate or a ceramic plate with an electrode thereon.

21. A method as set forth in claim 20, wherein said metal plate is made of stainless steel or nickel.

22. A method as set forth in claim 20, wherein said ceramic, plate is made of a ceramic oxide, a ceramic carbide or a ceramic nitride.

23. A method as set forth in claim 19, wherein said ceramic oxide powder has a particle size of 1 µm or less.

24. A method as set forth in claim 19, wherein said ceramic oxide powder is selected from the group consisting of lead zirconate titanate, a lead magnesium niobate and a solid solution of lead zirconate titanate and lead magnesium niobate.

25. A method as set forth in claim 24, wherein said ceramic oxide powder further comprises at least one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), Yttrium (Y), tantalum (Ta), tungsten (W), strontium (Sr), calcium (Ca), bismuth (Bi), tin (Sn), and manganese (Mn).

26. A method as set forth in claim 19, wherein said piezoelectric/electrostrictive film ranges, in thickness, from 5 to 100 µm.

27. A method as set forth in claim 26, wherein said piezoelectric/electrostrictive film ranges, in thickness, from 5 to 30 µm.

28. A method as set forth in claim 19, wherein said piezoelectric/electrostrictive film is formed by applying on said seeding layer a ceramic paste prepared from a mixture of a ceramic oxide powder, which has a particle size of 5 µm or less and is prepared from Pb and Ti-based piezoelectric/electrostrictive elements by a non-explosive oxidation-reduction combustion reaction at 100–500° C., with a second ceramic sol solution in water or an organic solvent, wherein the second ceramic sol solution comprises at least one component comprised in said ceramic oxide powder.

29. A method as set forth in claim 28, wherein said ceramic oxide powder is selected from the group consisting of a lead zirconate titanate, a lead magnesium niobate and a solid solution of lead zirconate titanate and lead magnesium niobate.

30. A method as set forth in claim 29, wherein said ceramic oxide powder further comprises at least one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), and manganese (Mn).

31. A method as set forth in claim 28, wherein said piezoelectric/electrostrictive film is formed in a printing process, a molding process or a coating process.

32. A method as set forth in claim 19, wherein said piezoelectric/electrostrictive film is prepared from a mixture of a dispersion of a ceramic oxide powder in a dispersant and a solution of a ceramic sol in an organic solvent.

33. A method as set forth in claim 19, wherein said ceramic oxide powder is selected from the group consisting of a lead zirconate titanate, a lead magnesium niobate and a solid solution composite oxide of lead zirconate titanate and lead magnesium niobate.

34. A method as set forth in claim 33, wherein said ceramic oxide powder further comprises one or more selected from the group consisting of nickel (Ni), lantanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), and manganese (Mn).

35. A method as set forth in claim 19, wherein said seeding layer has a thickness of 1 µm or less.

36. A method as set forth in claim 35, wherein said seeding layer has a thickness from 200 to 300 nm.

37. A method for fabricating a piezoelectric/electrostrictive thick film, using a seeding layer, comprising the steps of:
  providing a substrate;
  forming on the substrate the seeding layer from a first ceramic sol solution or a ceramic paste, wherein the first ceramic sol solution or ceramic paste comprises at least one component comprised in the piezoelectric/electrostrictive film, said ceramic paste being prepared from a mixture of a ceramic oxide powder, which has a particle size of 5 µm or less and is prepared from Pb and Ti-based piezoelectric elements by a non-explosive oxidation-reduction combustion reaction at 100–500° C., and a second ceramic sol solution in water or an organic solvent, wherein the second ceramic sol solution comprises at least one component comprised in said ceramic oxide powder;
  subjecting the seeding layer to an after-treatment to improve the reactivity of the seeding layer and to prevent undesirable reaction between the seeding layer and the substrate;

forming a piezoelectric/electrostrictive film on the seeding layer to a desirable thickness; and thermally treating the piezoelectric/electrostrictive film and the seeding layer at 100–600° C. to sinter the seeding layer and the piezoelectric/electrostrictive film and to solidify the bonding between the film and the substrate, whereby the piezoelectric/electrostrictive thick film is allowed to show a superb bonding to the substrate in the low temperature thermal treatment wherein said after-treatment includes a surface treatment process carried out by flowing organic vapor into a chamber in which said seeding layer formed on said substrate is placed.

38. A method as set forth in claim 37, wherein said substrate is a metal plate or a ceramic plate with an electrode thereon.

39. A method as set forth in claim 38, wherein said metal plate is made of stainless steel or nickel.

40. A method as set forth in claim 38, wherein said ceramic plate is made of a ceramic oxide, a ceramic carbide or a ceramic nitride.

41. A method as set forth in claim 37, wherein said ceramic oxide powder has a particle size of 1 µm or less.

42. A method as set forth in claim 37, wherein said ceramic oxide powder is selected from the group consisting of lead zirconate titanate, a lead magnesium niobate and a solid solution of lead zirconate titanate and lead magnesium niobate.

43. A method as set forth in claim 42, wherein said ceramic poxide powder further comprises at least one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), Yttrium (Y), tantalum (Ta), tungsten (W), strontium (Sr), calcium (Ca), bismuth (Bi), tin (Sn), and manganese (Mn).

44. A method as set forth in claim 37, wherein said piezoelectric/electrostrictive film ranges, in thickness, from 5 to 100 µm.

45. A method as set forth in claim 44, wherein said piezoelectric/electrostrictive film ranges, in thickness, from 5 to 30 µm.

46. A method as set forth in claim 37, wherein said piezoelectric/electrostrictive film is formed by applying on said seeding layer a ceramic paste prepared from a mixture of a ceramic oxide powder, which has a particle size of 5 µm or less and is prepared from Pb and Ti-based piezoelectric/electrostrictive elements by a non-explosive oxidation-reduction combustion reaction at 100–500° C., with a second ceramic sol solution in water or an organic solvent, wherein the second ceramic sol solution comprises at least one component comprised in said ceramic oxide powder.

47. A method as set forth in claim 46, wherein said ceramic oxide powder is selected from the group consisting of a lead zirconate titanate, a lead magnesium niobate and a solid solution of lead zirconate titanate and lead magnesium niobate.

48. A method as set forth in claim 47, wherein said ceramic oxide powder further comprises at least one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), and manganese (Mn).

49. A method as set forth in claim 46, wherein said piezoelectric/electrostrictive film is formrd in a printing process, a molding process or a coating process.

50. A method as set forth in claim 37, wherein said piezoelectric/electrostrictive film is prepared from a mixture of a dispersion of a ceramic oxide powder in a dispersant and a solution of a ceramic sol in an organic solvent.

51. A method as set forth in claim 50, wherein said ceramic oxide powder is selected from the group consisting of a lead zirconate titanate, a lead magnesium niobate and a solid solution composite oxide of lead zirconate titanate and lead magnesium niobate.

52. A method as set forth in claim 51, wherein said ceramic oxide powder further comprises one or more selected from the group consisting of nickel (Ni), lantanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), stronturn (Sr), calcium (Ca), bismuth (Bi), tin (Sn), and manganese (Mn).

53. A method as set forth in claim 37, wherein said seeding layer has a thickness of 1 µm or less.

54. A method as set forth in claim 53, wherein said seeding layer has a thickness from 200 to 300 nm.

55. A method for fabricating a piezoelectric/electrostrictive thick film, using a seeding layer, comprising the steps of:

providing a substrate;

forming on the substrate the seeding layer from a first ceramic sol solution or a ceramic paste, wherein the first ceramic sol solution or ceramic paste comprises at least one component comprised in the piezoelectric/electrostrictive film, said ceramic paste being prepared from a mixture of a ceramic oxide powder, which has a particle size of 5 µm or less and is prepared from Pb and Ti-based piezoelectric elements by a non-explosive oxidation-reduction combustion reaction at 100–1500° C., and a second ceramic sol solution in water or an organic solvent, wherein the second ceramic sol solution comprises at least one component comprised in said ceramic oxide powder;

partially drying said seeding layer at room temperature to 150° C. to provide said seeding layer with a proper viscosity for bonding;

attaching on aid partially dried seeding layer a piezoelectric/electrostrictive film, said piezoelectric/electrostrictive film being separately formed from a ceramic oxide powder which has a particles size of 5 µm or less and is prepared from Pb and Ti-based piezoelectric elements by a non-explosive oxidation-reduction combustion reaction at a low temperature of 100–1500° C.; and thermally treating said piezoelectric/electrostrictive film at 100 to 600° C. to sinter the seeding layer and the piezoelectric/electrostrictive film and to solidify the bonding between the film and the substrate, whereby the piezoelectric/electrostrictive thick film is allowed to show superb bonding to the substrate in the low temperature thermal treatment.

56. A method as set forth in claim 55, wherein said substrate is a metal plate or a ceramic plate with an electrode thereon.

57. A method as set forth in claim 56, wherein said metal plate is made of stainless steel or nickel.

58. A method as set forth in claim 56, wherein said ceramic plate is made of a ceramic oxide, a ceramic carbide or a ceramic nitride.

59. A method as set forth in claim 55, wherein said ceramic oxide powder has a particle size of 1 µm or less.

60. A method as set forth in claim 55, wherein said ceramic oxide powder is selected from the group consisting of a lead zirconate titanate, a lead magnesium niobate and a solid solution composite oxide of lead zirconate titanate and lead magnesium niobate.

61. A method as set forth in claim 60, wherein said ceramic oxide powder further comprises at least one selected from the group consisting of nickel (Ni), lantanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), and manganese (Mn).

62. A method as set forth in claim 55, further comprising the step of pre-baking the piezoelectric/electrostrictive film at 100 to 150° C. after the attaching step and before the thermally treating step.

63. A method as set forth in claim 55, wherein the thermally treating step is carried out under pressure so as to give a uniform bonding between the piezoelectric/electrostrictive film and the substrate.

64. A method as set forth in claim 55, wherein said piezoelectric/electrostrictive film ranges, in thickness, from 1 to 100 $\mu$m.

65. A method as set forth in claim 64, wherein said piezoelectric/electrostrictive film ranges, in thickness, from 5 to 30 $\mu$m.

66. A method as set forth in claim 55, wherein said seeding layer has a thickness of 1 $\mu$m or less.

67. A method as set forth in claim 66, wherein said seeding layer has a thickness from 200 to 300 nm.

68. A method as set forth in claim 55, wherein said partially drying step is carried out at room temperature to 150° C.

69. A method as set forth in claim 68, wherein said partially drying step is carried out at 50 to 70° C.

70. A method as set forth in claim 55, wherein said partially drying step is carried out by drying said seeding layer in a drying chamber saturated with the vapor of an organic solvent and volatilizing the solvent at a proper temperature from the seeding layer, said organic solvent being identical to that used to prepare the ceramic sol for the seeding layer.

71. A method as set forth in claim 55, wherein said thermally treating step is carried out at 150–300° C.

72. A method for fabricating a piezoelectric/electrostrictive thick film, using a seeding layer, comprising the steps of:
providing a substrate;
forming on the substrate the seeding layer from a first ceramic sol solution or a ceramic paste, wherein the first ceramic sol solution or ceramic paste comprises at least one component comprised in the piezoelectric/electrostrictive film, said ceramic paste being prepared from a mixture of a ceramic oxide powder, which has a particle size of 5 $\mu$m or less and is prepared from Pb and Ti-based piezoelectric elements by a non-explosive oxidation-reduction combustion reaction at 100–1500° C., and a second ceramic sol solution in water or an organic solvent, wherein the second ceramic sol solution comprises at least one component comprised in said ceramic oxide powder;
partially drying said seeding layer at room temperature to 150° C. to provide said seeding layer with a proper viscosity for bonding;
attaching a piezoelectric/electrostrictive film, separately formed and sintered, on said partially dried seeding layer; and
thermally treating said piezoelectric/electrostrictive film at 100 to 600° C. to sinter the seeding layer and the piezoelectric/electrostrictive film and to solidify the bonding between the film and the substrate,
whereby the piezoelectric/electrostrictive thick film is allowed to show superb bonding to the substrate in the low temperature thermal treatment.

73. A method as set forth in claim 72, wherein said substrate is a metal plate or a ceramic plate with an electrode thereon.

74. A method as set forth in claim 73, wherein said metal plate is made of stainless steel or nickel.

75. A method as set forth in claim 73, wherein said ceramic plate is made of a ceramic oxide, a ceramic carbide or a ceramic nitride.

76. A method as set forth in claim 72, wherein said ceramic oxide powder has a particle size of 1 $\mu$m or less.

77. A method as set forth in claim 72, wherein said ceramic oxide powder is selected from the group consisting of a lead zirconate titanate, a lead magnesium niobate and a solid solution of lead zirconate titanate and lead magnesium niobate.

78. A method as set forth in claim 77, wherein said ceramic oxide powder further comprises at least one selected from the group consisting of nickel (Ni), lanthanum (La), barium (Ba), zinc (Zn), lithium (Li), cobalt (Co), cadmium (Cd), cerium (Ce), chrome (Cr), antimony (Sb), iron (Fe), yttrium (Y), tantalum (Ta), tungsten (W), strontium (Sr), calcium (Ca), bismuth (Bi), tin (Sn), and manganese (Mn).

79. A method as set forth in claim 72, further comprising the step of pre-baking the piezoelectric/electrostrictive film at 100 to 150° C. after the attaching step and before the thermally treating step.

80. A method as set forth in claim 72, wherein the thermally treating step is carried out under pressure so as to give a uniform bonding between the piezoelectric/electrostrictive film and the substrate.

81. A method as set forth in claim 72, wherein said piezoelectric/electrostrictive film ranges, in thickness, from 1 to 100 $\mu$m.

82. A method as set forth in claim 81, wherein said piezoelectric/electrostrictive film ranges, in thickness, from 5 to 30 $\mu$m.

83. A method as set forth in claim 72, wherein said seeding layer has a thickness of 1 $\mu$m or less.

84. A method as set forth in claim 83, wherein said seeding layer has a thickness from 200 to 300 nm.

85. A method as set forth in claim 72, wherein said partially drying step is carried out at room temperature to 150° C.

86. A method as set forth in claim 85, wherein said partially drying step is carried out at 50 to 70° C.

87. A method as set forth in claim 72, wherein said partially drying step is carried out by drying said seeding layer in a drying chamber saturated with the vapor of an organic solvent and volatilizing the solvent at a proper temperature from the seeding layer, said organic solvent being identical to that used to prepare the ceramic sol for the seeding layer.

88. A method as set forth in claim 72, wherein said thermally treating step is carried out at 150–300° C.

* * * * *

UNITED STATES PATENT AND TRADEMARK OFFICE
CERTIFICATE OF CORRECTION

PATENT NO. : 6,432,238 B1
DATED : August 13, 2002
INVENTOR(S) : Sang Kyeong Yun et al.

It is certified that error appears in the above-identified patent and that said Letters Patent is hereby corrected as shown below:

<u>Title page,</u>
Item [73], Assignee, "Samsung Electro-Mechanicals Co., Ltd." should be
-- Samsung Electro-Mechanics Co., Ltd. --.

Signed and Sealed this

Twenty-seventh Day of May, 2003

JAMES E. ROGAN
*Director of the United States Patent and Trademark Office*